(12) United States Patent
Cho et al.

(10) Patent No.: US 7,892,320 B2
(45) Date of Patent: Feb. 22, 2011

(54) AUTOMATICALLY REPLACEABLE APPARATUS FOR COLLECTING BYPRODUCTS AND THE CONTROLLING METHOD THEREOF IN EQUIPMENT PRODUCING SEMICONDUCTOR

(75) Inventors: Che-Hoo Cho, Pyungtaeck (KR);
Seung-Il Lee, Hwasung (KR);
Young-Jun Yun, Hwasung (KR)

(73) Assignee: Milaebo Co., Ltd., Hwasung (KR)

( * ) Notice: Subject to any disclaimer, the term of this patent is extended or adjusted under 35 U.S.C. 154(b) by 222 days.

(21) Appl. No.: 12/373,482

(22) PCT Filed: Sep. 8, 2006

(86) PCT No.: PCT/KR2006/003575

§ 371 (c)(1),
(2), (4) Date: Jan. 12, 2009

(87) PCT Pub. No.: WO2008/007824

PCT Pub. Date: Jan. 17, 2008

(65) Prior Publication Data

US 2009/0306808 A1    Dec. 10, 2009

(30) Foreign Application Priority Data

Jul. 13, 2006    (KR) .................. 10-2006-0065771

(51) Int. Cl.
*B01D 46/46* (2006.01)
(52) U.S. Cl. ................. 95/19; 95/20; 55/283; 55/284; 55/286; 55/287; 55/288; 55/385.2; 96/228; 96/233; 96/421
(58) Field of Classification Search ............ 95/19, 95/20; 55/283, 284, 286, 287, 288, 282.2, 55/385.2; 96/228, 233, 230, 421
See application file for complete search history.

(56) References Cited

U.S. PATENT DOCUMENTS 7,217,306 B2 * 5/2007 Nomura et al. ............... 55/309

FOREIGN PATENT DOCUMENTS

| JP | 11114337 A | 4/1999 |
|---|---|---|
| KR | 1020010077233 A | 8/2001 |
| KR | 1020050114896 A | 12/2005 |

* cited by examiner

*Primary Examiner*—Robert A Hopkins
(74) *Attorney, Agent, or Firm*—Arent Fox LLP

(57) ABSTRACT

Disclosed herein are an automatically replaceable apparatus for collecting byproducts in semiconductor producing equipment and a control method thereof. The apparatus includes several trap units mounted to a vertical shaft at regular angular intervals and rotating in response to a driving direction of a servo motor. Upper and lower plates support the vertical shaft, and connect byproduct inlet and outlet ports, cleaning-water supply and discharge ports, and dry-gas supply and exhaust ports to the respective trap units. Trap and plate coupling means are extended at normal times to air-tightly seal gaps between the upper and lower plates and the trap units, and contracted when the trap units are rotated in a predetermined direction for the replacement. The servo motor is mounted to a lower surface of the lower plate and rotates the trap units within a predetermined angular range. A control unit controls the operation of the components.

15 Claims, 8 Drawing Sheets

[Fig. 1]
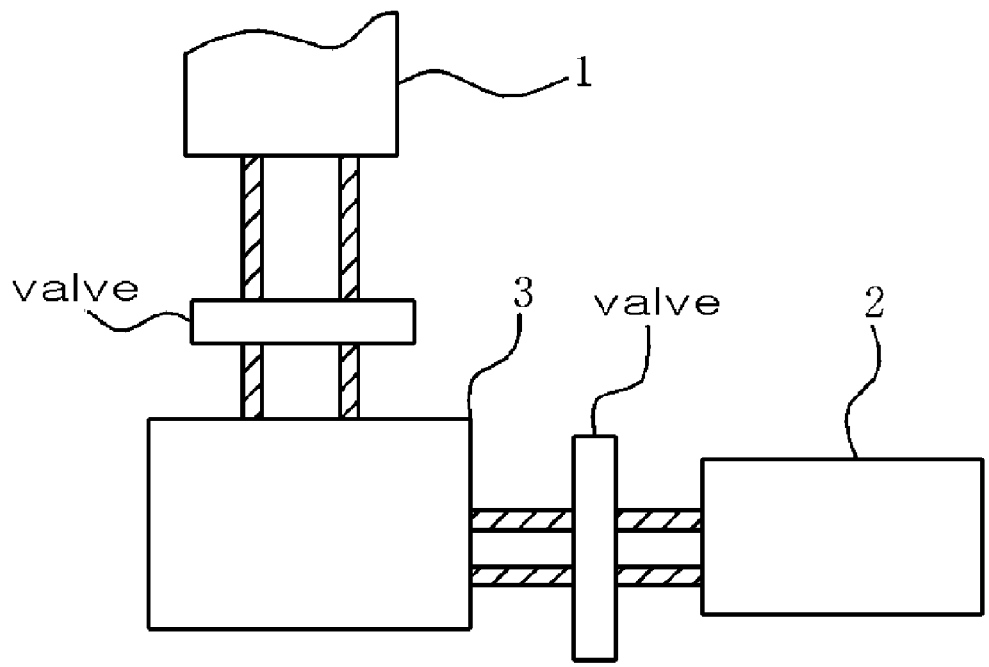
[Fig. 2]
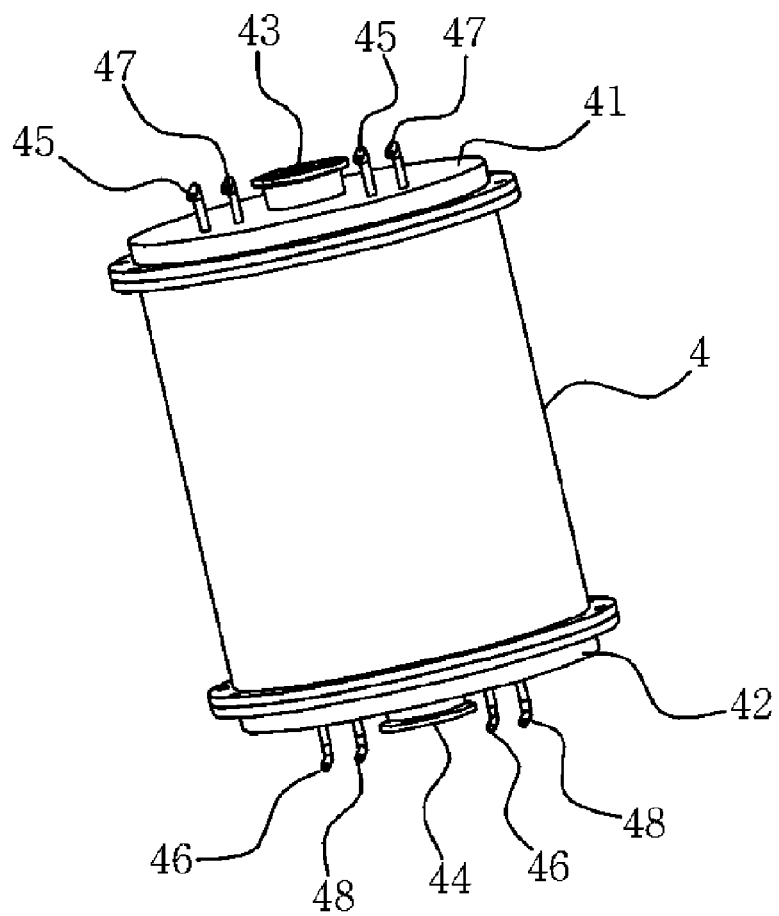

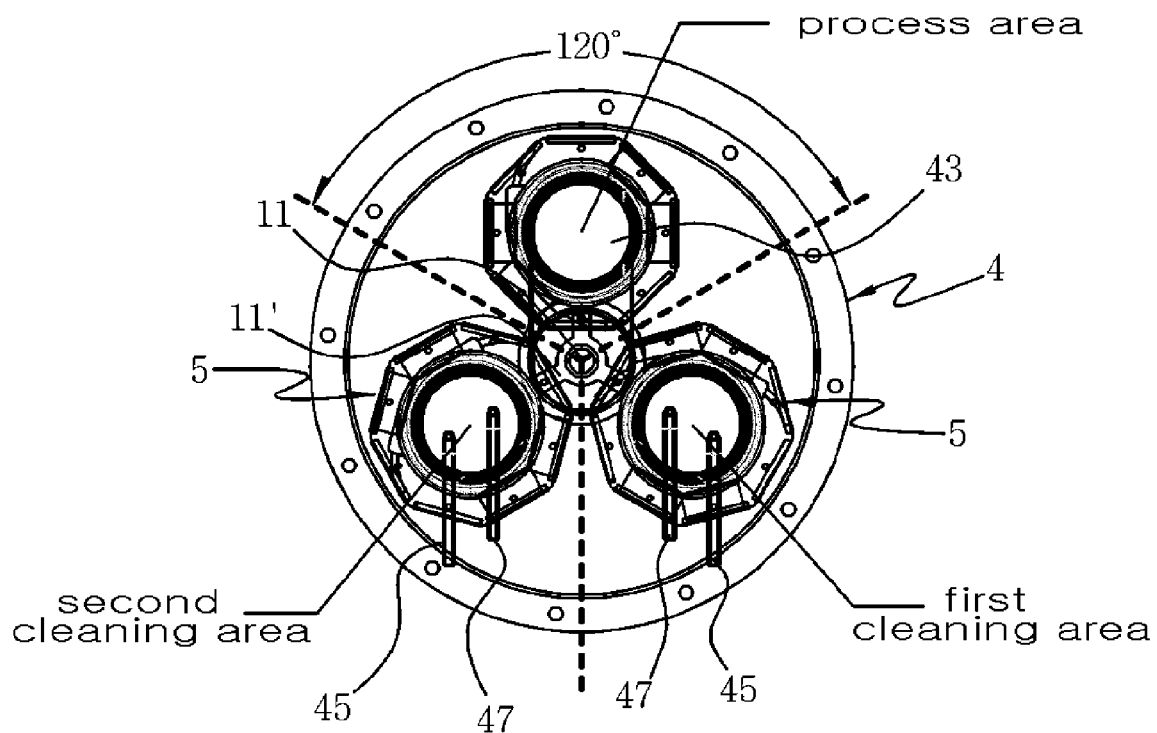
[Fig. 3]
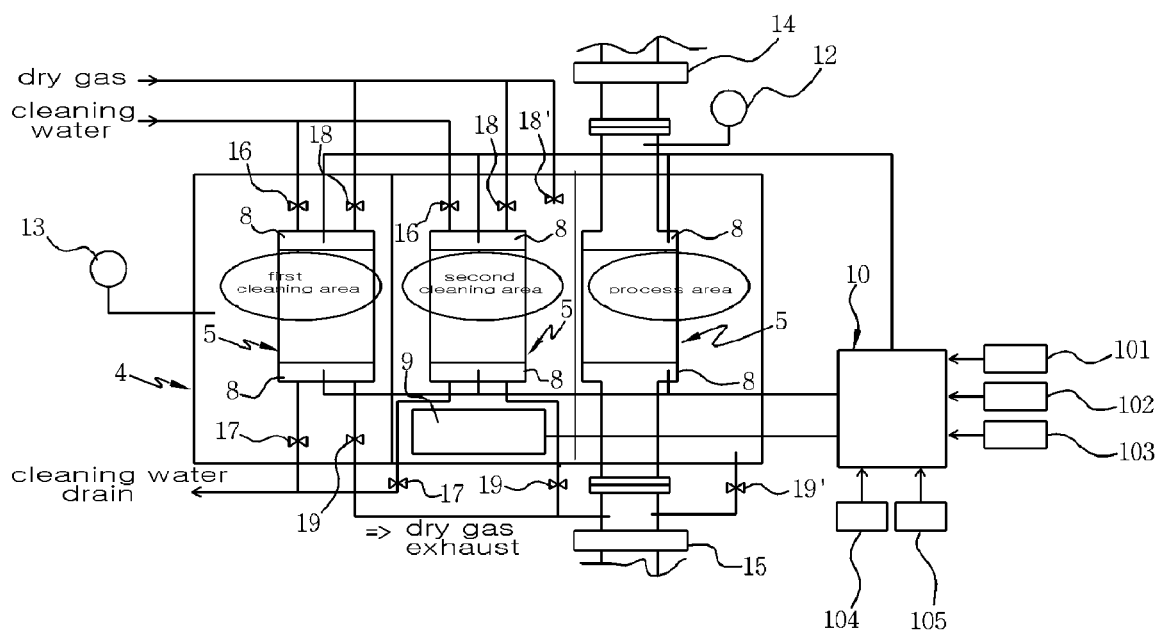
[Fig. 4]

[Fig. 5]
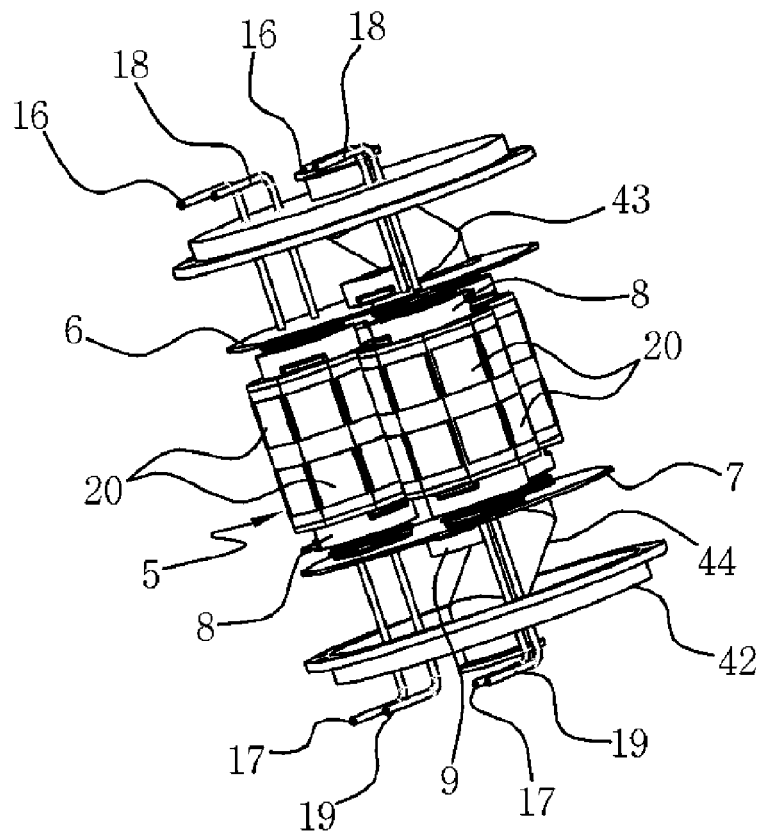
[Fig. 6]
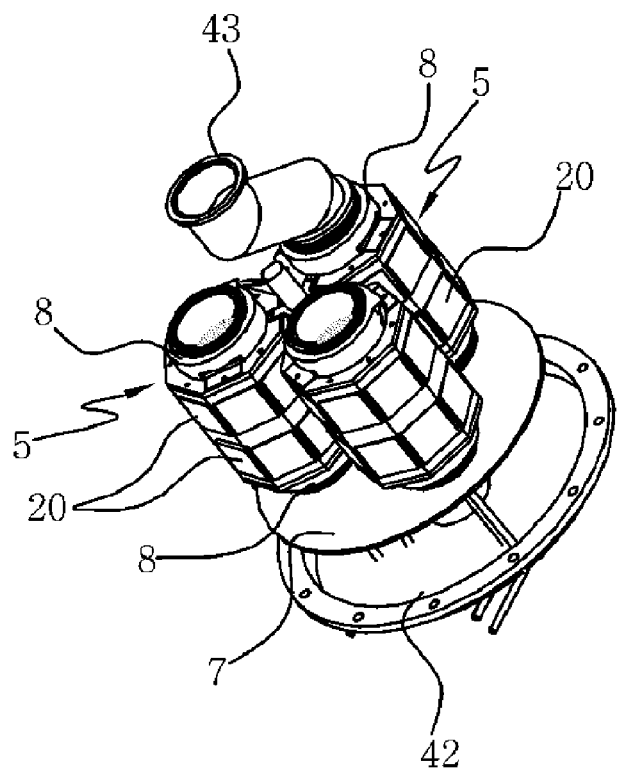

[Fig. 7]
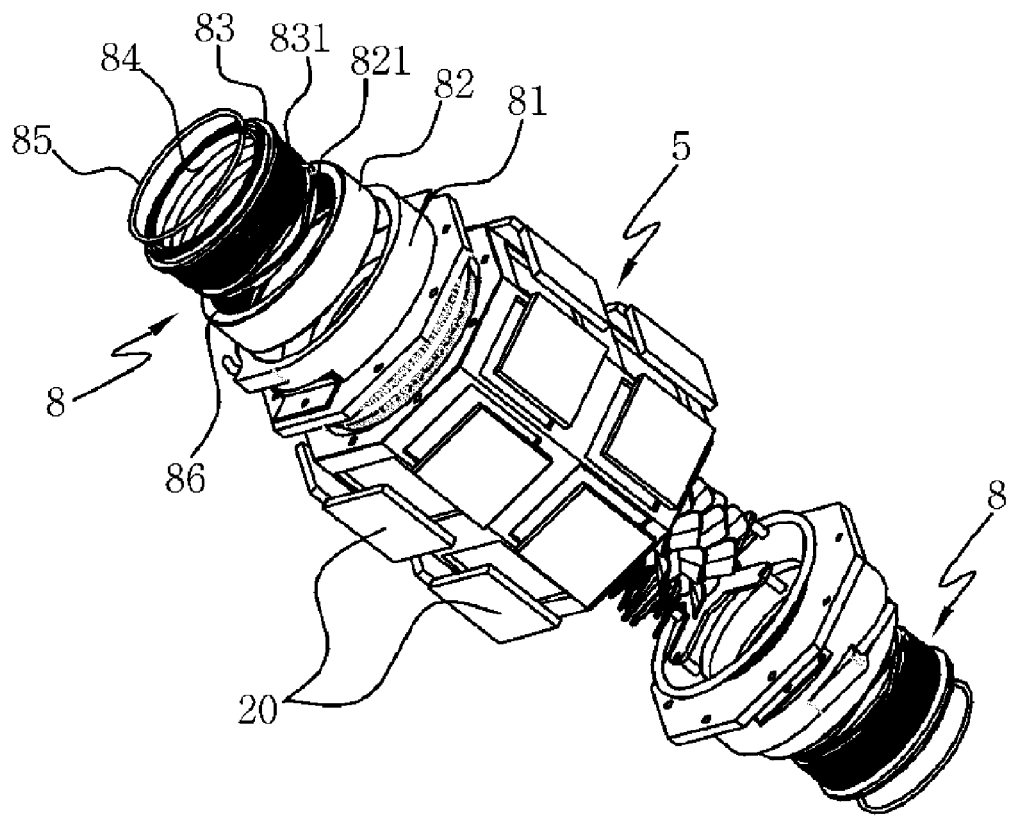
[Fig. 8]
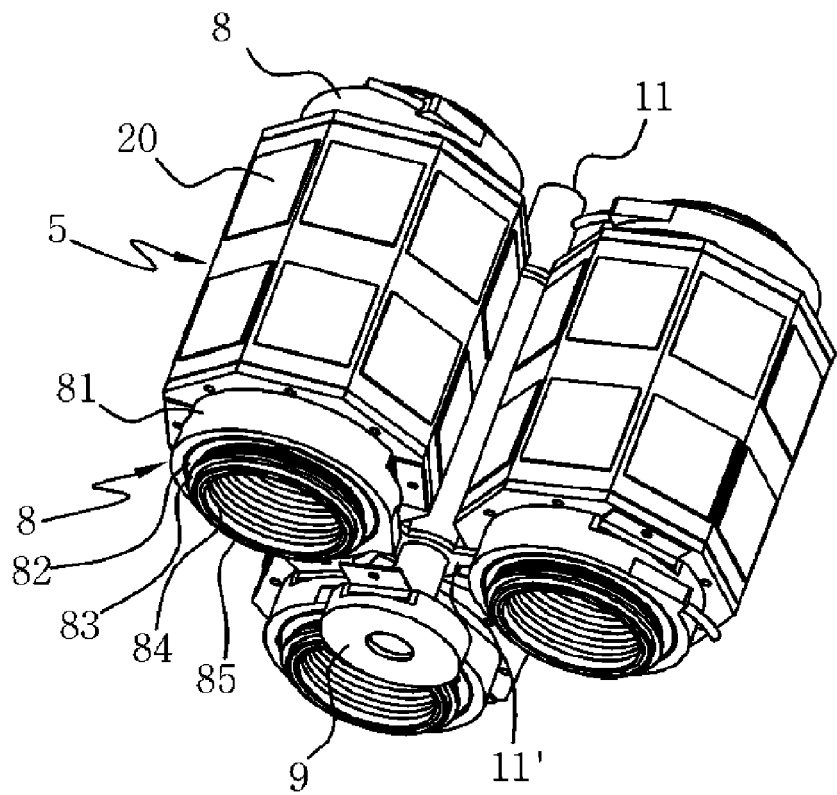

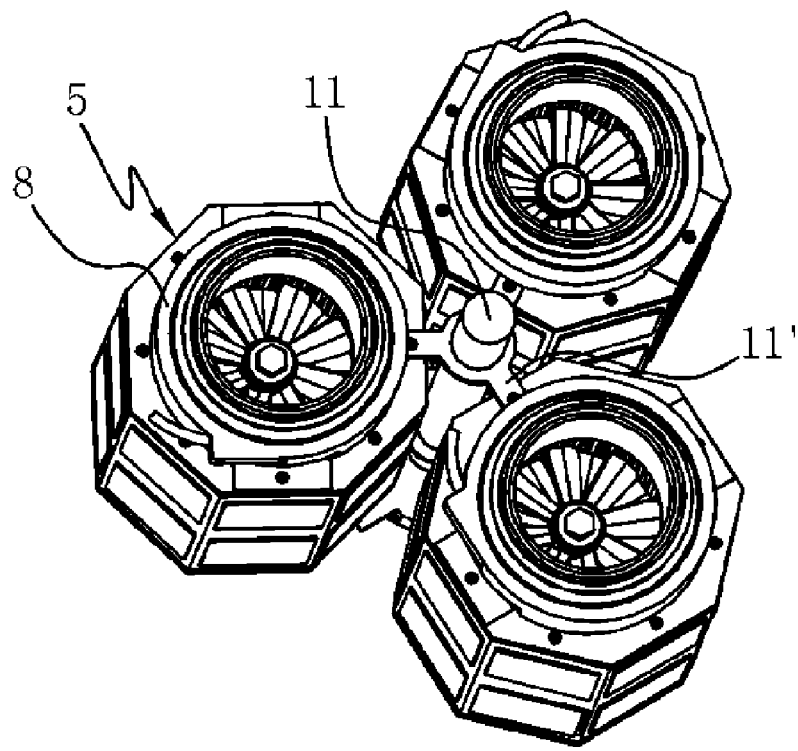
[Fig. 9]
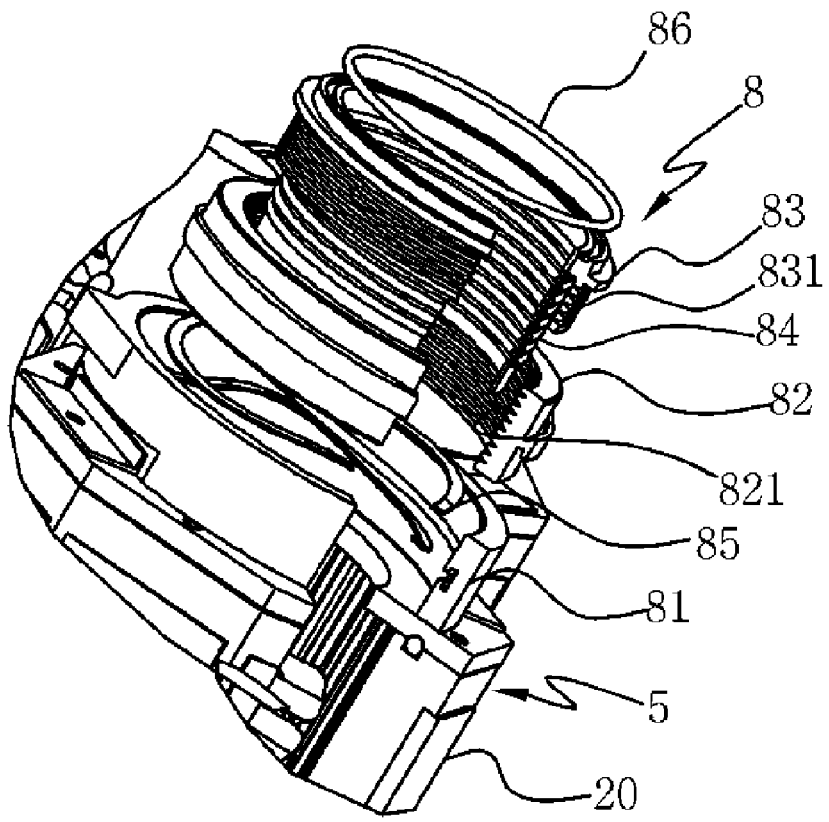
[Fig. 10]

[Fig. 11]
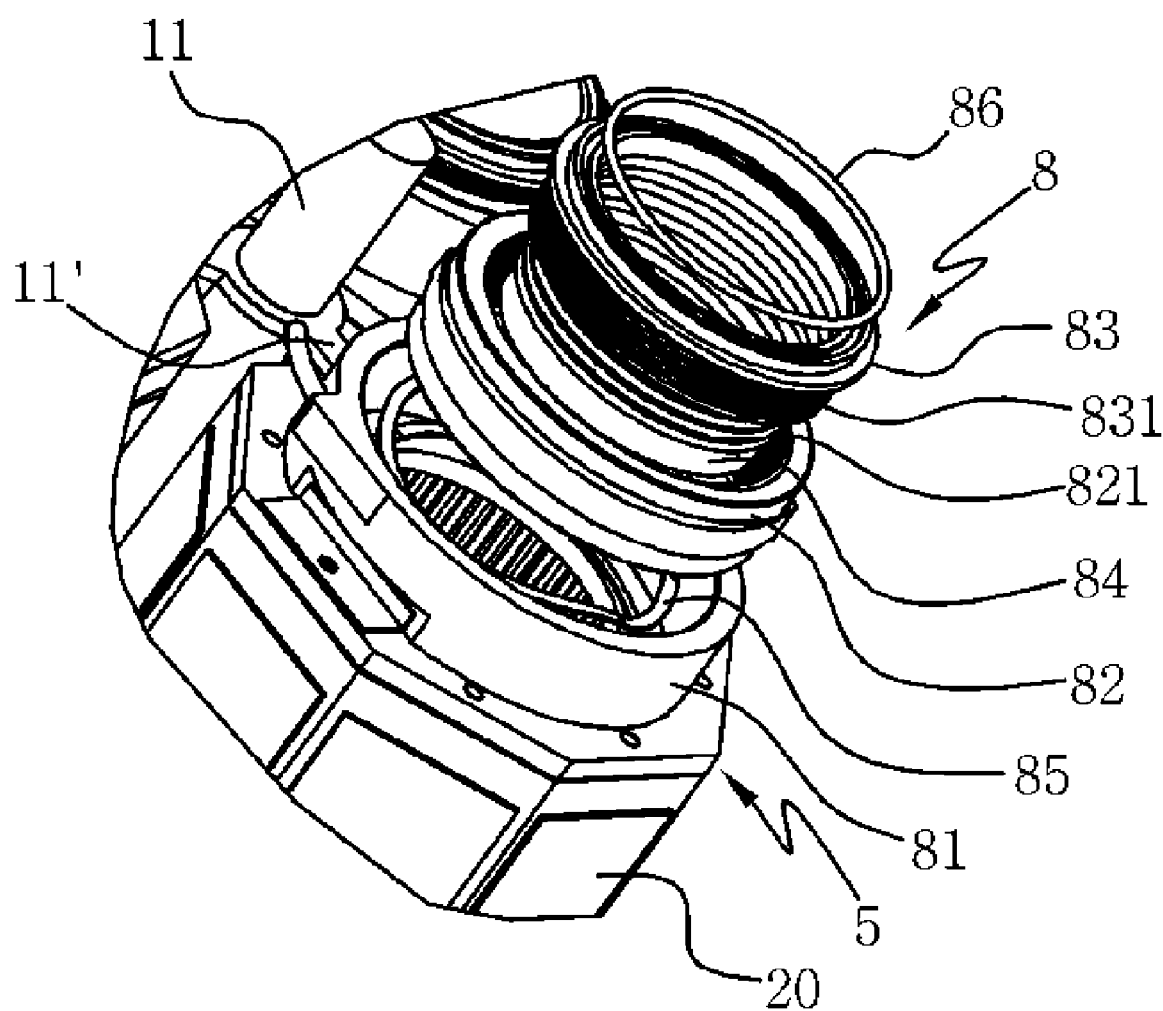

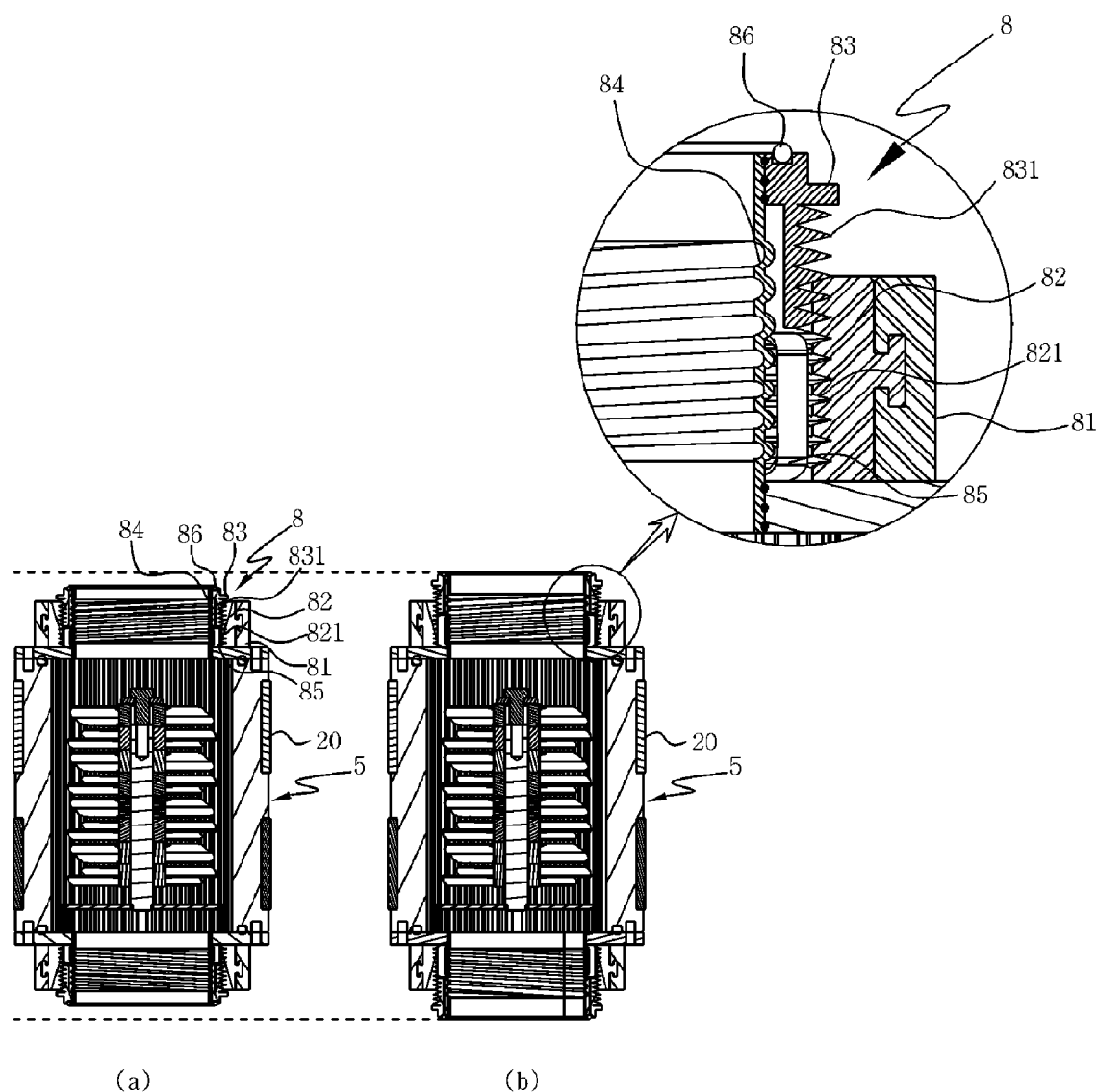
[Fig. 12]

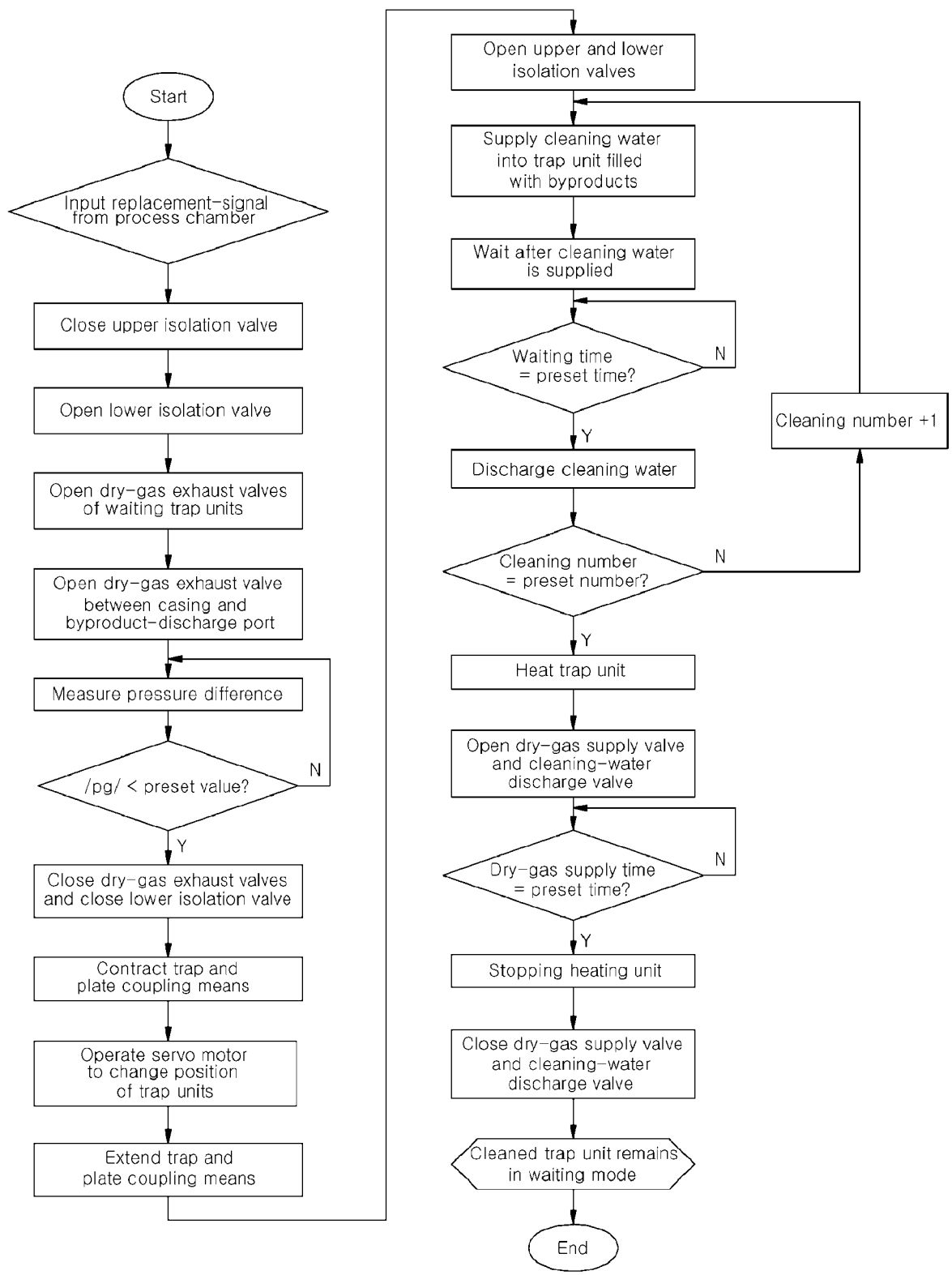

US 7,892,320 B2

AUTOMATICALLY REPLACEABLE APPARATUS FOR COLLECTING BYPRODUCTS AND THE CONTROLLING METHOD THEREOF IN EQUIPMENT PRODUCING SEMICONDUCTOR

CROSS-REFERENCE TO RELATED APPLICATION

This application is a National Stage entry of International Application No. PCT/KR2006/003575, filed Sep. 8, 2006, the entire specification claims and drawings of which are incorporated herewith by reference.

TECHNICAL FIELD

The present invention relates, in general, to an automatically replaceable apparatus for collecting byproducts in semiconductor producing equipment and a method of controlling the apparatus and, more particularly, to an automatically replaceable apparatus for collecting byproducts in semiconductor producing equipment and a method of controlling the apparatus, in which several trap units are movably or rotatably installed in the collecting apparatus to collect byproducts produced during the semiconductor fabricating process, such as poisonous gases (ignitable gas, corrosive gas, noxious gas or harmful compounds), such that, when a predetermined amount of byproduct is collected in any one of the trap units, the task of collection of the byproduct is automatically transferred to another trap unit which has been cleaned, thus increasing the operation rate of the byproduct collecting apparatus, therefore increasing the production of semiconductors, preventing injuries to workers due to the effluence of harmful substances or noxious gases which may be produced when the byproduct collecting apparatus is replaced with another one, and ensuring safety.

BACKGROUND ART

Generally, a semiconductor manufacturing process comprises a fabrication process and an assembly process. The fabrication process is defined as the process of manufacturing semiconductor chips in various process chambers. That is, a thin film is deposited on a wafer and selectively etched. These steps are repeated, thus processing a specific pattern. Meanwhile, the assembly process is defined as the process of individually separating the chips manufactured through the fabrication process, and coupling each chip to a lead frame, thus providing a finished product.

In this case, the process of depositing the thin film on the wafer or etching the film deposited on the wafer is conducted in a process chamber at a high temperature using noxious gases, such as Silane, Arsine, or boron chloride, and a process gas, such as hydrogen. While the process is conducted, various kinds of ignitable gases and noxious gases containing corrosive impurities and noxious elements are produced in the process chamber in large quantities.

Thus, the semiconductor manufacturing equipment is provided with a scrubber. The scrubber is mounted to the rear end of a vacuum pump which creates a vacuum in the process chamber, and purifies exhaust gas discharged from the process chamber prior to being discharged to the atmosphere.

That is, in the fabrication process of depositing the thin film on the wafer, etching the thin film, and repeating the depositing operation and the etching operation in the process chamber, thus forming a pattern, and thereby manufacturing a semiconductor chip, the byproducts produced in the chamber are fed through an exhaust line to the vacuum pump for creating a vacuum in the chamber and the scrubber for processing harmful compounds.

However, reactive compounds are deposited on the exhaust line, the vacuum pump, the scrubber, and other parts, so that associated apparatus may develop problems, and the lifespan of the apparatus may be shortened. Consequently, this affects the process of treating the wafer.

In order to solve the problem, as shown in FIG. 1, a collector 3 is mounted between the rear end of the process chamber 1 and the front end of the vacuum pump 2, thus allowing the byproducts fed from the chamber to be immediately collected and received therein.

However, it takes a long time to collect various kinds of reactive byproducts using one collector 3, and a large amount of byproducts is collected in the collector 3, so that a gas flow passage is narrowed. Consequently, the pressure of the process chamber required for the wafer treating process cannot be controlled, so that it is difficult to conduct the process.

Thus, when the accumulated amount in the conventional collector, having a construction limited to a predetermined volume, exceeds a predetermined amount, the collector must be replaced with a new one. The conventional collector is manually replaced with a new one.

The byproduct collecting apparatus of the semiconductor producing equipment is exposed to and collects ignitable gas, corrosive gas, noxious gas, and harmful compounds. When the byproduct collecting apparatus has been used for a lengthy period of time, the collector is filled with the byproducts. In order to replace the collector with a new one, the collector itself must be separated from the process chamber. As such, when the collector is separated from the chamber, some of the harmful substances or gases are exposed to the outside. This compromises safety. Further, because of the time spent on the replacement, the operation rate of the process chamber and the productivity thereof are reduced.

DISCLOSURE OF INVENTION

Technical Problem

Accordingly, the present invention has been made keeping in mind the above problems occurring in the prior art, and an object of the present invention is to provide an automatically replaceable apparatus for collecting byproducts in semiconductor producing equipment and a method of controlling the apparatus, in which several trap units are rotatably installed in the collecting apparatus to collect byproducts produced during the semiconductor fabricating process, such as ignitable gas, corrosive gas, noxious gas or harmful compounds, such that, when a predetermined amount of byproduct is collected in any one of the trap units, the task of collection of the byproduct is automatically transferred to another trap unit which has been cleaned, thus increasing the operation rate of the byproduct collecting apparatus, therefore increasing the production of semiconductors, preventing injuries to workers due to the effluence of harmful substances or noxious gases which may be produced when the byproduct collecting apparatus is replaced with another one, and ensuring safety.

Technical Solution

In order to accomplish the object, the present invention provides an automatically replaceable collecting apparatus for collecting byproducts produced in a semiconductor production line, the collecting apparatus being constructed so that a trap collecting various kinds of byproducts is installed in a cylindrical casing which is open at a top and bottom thereof and so that a lid having each of a byproduct inlet port and a byproduct outlet port is mounted to each of upper and lower openings of the casing to close each of the upper and lower openings, and being installed between a process chamber and a vacuum pump, the collecting apparatus including a plurality of trap units, upper an lower plates, trap and plate coupling means, a servo motor, pressure gauges, upper and lower isolation valves, cleaning-water supply and discharge valves and dry-gas supply and exhaust valves, and a control unit.

The trap units are mounted to a vertical shaft provided in the center of the casing at regular angular intervals, and rotate leftwards or rightwards between upper and lower plates in response to a driving direction of a motor. While the trap units are connected to byproduct inlet and outlet ports, cleaning-water supply and discharge ports, and dry-gas supply and exhaust ports, one of the trap units collects the byproducts and the rest of the trap units are repeatedly cleaned.

The upper and lower plates support the vertical shaft to which the trap units are mounted such that the vertical shaft passes through centers of the upper and lower plates, and are provided around the trap units to be spaced apart from the upper and lower lids by a predetermined interval, and are provided with the byproduct inlet and outlet ports, the cleaning-water supply and discharge ports, and the dry-gas supply and exhaust ports. The upper and lower plates contact the upper and lower openings of the trap units at upper and lower positions of the casing, and connect the byproduct inlet and outlet ports, the cleaning-water supply and discharge ports, and the dry-gas supply and exhaust ports to the respective trap units.

The trap and plate coupling means are installed on the upper and lower openings of the trap units in such a way as to contract or extend. The trap and plate coupling means are extended at normal times to air-tightly seal gaps between the upper and lower plates and the trap units, and are contracted when the trap units are rotated in a predetermined direction for the replacement of the trap units, thus allowing the trap units to smoothly rotate.

The servo motor is mounted to a lower surface of the lower plate while a shaft of the servo motor is connected to a lower end of the vertical shaft, and rotates forwards or backwards in response to a signal output from a control unit, thus rotating the trap units within a predetermined angular range.

The pressure gauges are mounted to the byproduct inlet port and the casing, respectively, thus detecting and displaying pressure in a trap unit that is currently collecting the byproducts and pressure in the casing, and simultaneously transmit detected pressure signals to the control unit, thus allowing a time when the trap unit is replaced with another one to be indicated.

The upper and lower isolation valves are mounted on the byproduct inlet and outlet ports, respectively, so as to control the ingress of the byproducts into a specific trap unit or the discharge of the byproducts from the trap unit.

The cleaning-water supply and discharge valves and the dry-gas supply and exhaust valves are provided on the cleaning-water supply and discharge ports and the dry-gas supply and exhaust ports, respectively, thus controlling the supply and discharge of cleaning water and dry gas.

The control unit is provided with a control program, timers for setting the time supplying cleaning water and dry gas, and cleaning-number and pressure setting parts. The control unit controls the operation of the servo motor, the trap and plate coupling means, and various kinds of valves.

The control unit includes a pressure-difference comparison part to compare pressure in the casing with pressure in the trap unit collecting the byproducts, thus detecting a pressure difference, timers for setting a cleaning-water supplying time and a dry-gas supplying time, and setting parts for setting a cleaning number and pressure.

Further, a thermoelement is mounted to an outer portion of each of the trap units. When the trap unit is collecting the byproducts, the thermoelement is operated such that the trap unit maintains low temperature, thus increasing a collecting effect. Meanwhile, when the trap unit filled with the byproducts is cleaned by the cleaning water and is dried by the supply of the dry gas, the thermoelement conducts a heating operation at high temperature, thus increasing drying efficiency.

Further, the dry-gas exhaust port connected to each of the trap units is coupled to the byproduct discharge port connected to the vacuum pump. As necessary, the dry-gas supply and exhaust ports having the dry-gas supply and exhaust valves are formed through the upper and lower plates of the casing, the dry-gas exhaust port being coupled to the byproduct discharge port connected to the vacuum pump.

Each trap and plate coupling means includes an encoder motor which is mounted around each of the upper and lower openings of each of the trap units and includes a ring-shaped rotor having on an inner surface thereof a thread engaging with a thread of a bellows housing, a bellows housing which has on an outer surface thereof the thread engaging with the thread of the rotor of the encoder motor and is installed in the rotor of the encoder motor to contract or extend a bellows in response to a driving direction of the encoder motor, so that the bellows housing is in contact with or is spaced apart from each of the upper and lower plates, and a bellows which is installed such that an outer end thereof is welded to an upper or lower end in the bellows housing and an inner end thereof is welded to an inner surface of the upper or lower opening of each of the trap units. The bellows contracts or extends in response to a vertical moving direction and a moving distance of the bellows housing coupled to the rotor of the encoder motor, thus maintaining airtightness between the bellows housing and each of the trap units. The trap and plate coupling means also includes a spring which is elastically installed between an end of the bellows housing fastened to the rotor through a screw-type fastening method and an upper or lower surface of each of the trap units, and an O-ring which is mounted to each of upper and lower surfaces on an outer portion of the bellows housing, thus sealing a contact part between the bellows housing and each of the upper and lower plates.

Further, in order to accomplish the object, the present invention provides a method of controlling an automatically replaceable byproduct collecting apparatus in semiconductor producing equipment, including closing an upper isolation valve mounted to a byproduct inlet port, and opening a lower isolation valve mounted to a byproduct discharge port, when a replacement-time indicating signal, corresponding to pressure variation in a trap unit that is currently operating, is input from a process chamber to a control unit, and thereafter, opening a dry-gas exhaust valve of a trap unit that has been cleaned and remains in a waiting mode, and opening a dry-gas exhaust valve provided between a casing and the byproduct discharge port; closing the lower isolation valve and the dry-gas exhaust valve coupled to the trap unit that has been cleaned and remains in the waiting mode, and contracting trap and plate coupling means, so that an upper or lower portion of each of the trap units moves away from an upper or lower plate, when inlet pressure and outlet pressure of the trap unit that is currently operating are compared with each other and it is determined that a pressure difference is less than a preset value; driving a servo motor in a predetermined direction to change positions of the trap units, and extending the trap and plate coupling means, thus maintaining the upper or lower portion of each of the trap units in close contact with the upper or lower plate, therefore maintaining airtightness; opening each of the upper and lower isolation valves, supplying a predetermined amount of cleaning water into the trap unit that is filled with byproducts, maintaining the state for a preset time, and thereafter opening a cleaning-water discharge valve, thus discharging the cleaning water, and repeating the cleaning-water discharging operation a preset number of times; driving a thermoelement mounted to an outer portion of each of the trap units for a preset time, thus heating the trap unit, and simultaneously opening the dry-gas supply valve and the cleaning-water discharge valve; and stopping heating after a preset time has passed, and closing the dry-gas supply valve and the cleaning-water discharge valve, thus completing a cleaning operation.

BRIEF DESCRIPTION OF THE DRAWINGS

FIG. 1 is a view illustrating a byproduct collecting apparatus in semiconductor fabricating equipment;

FIG. 2 is a view showing the appearance of an apparatus, according to the present invention;

FIG. 3 is a plan sectional view showing the apparatus, according to the present invention;

FIG. 4 is a schematic block diagram of the apparatus, according to the present invention;

FIGS. 5 and 6 are perspective views showing the apparatus, according to the present invention, when an outer casing and an upper lid have been removed;

FIG. 7 is an exploded perspective view showing a trap unit of the apparatus, according to the present invention;

FIGS. 8 and 9 are a bottom perspective view and a plan perspective view showing the state where the trap units, a vertical shaft, and a servo motor of the apparatus according to the present invention are coupled to each other;

FIGS. 10 and 11 are an enlarged cutaway perspective view and an enlarged exploded perspective view showing a trap and plate coupling means of the apparatus, according to the present invention;

FIGS. 12a and 12b are sectional views showing the trap and plate coupling means of the apparatus, according to the present invention; and FIG. 13 is a flowchart illustrating the method of the present invention.

MODE FOR THE INVENTION

Hereinafter, the preferred embodiment of the present invention will be described in detail with reference to the accompanying drawings.

FIG. 2 is a view showing the appearance of an apparatus, according to the present invention, FIG. 3 is a plan sectional view showing the apparatus, according to the present invention, FIG. 4 is a schematic block diagram of the apparatus, according to the present invention, FIGS. 5 and 6 are perspective views showing the apparatus, according to the present invention, when an outer casing and an upper lid have been removed, and FIG. 7 is an exploded perspective view showing a trap unit of the apparatus, according to the present invention.

FIGS. 8 and 9 are a bottom perspective view and a plan perspective view showing the state where the trap units, a vertical shaft, and a servo motor of the apparatus according to the present invention are coupled to each other, FIGS. 10 and 11 are an enlarged cutaway perspective view and an enlarged exploded perspective view showing a trap and plate coupling means of the apparatus, according to the present invention, and FIGS. 12a and 12b are sectional views showing the trap and plate coupling means of the apparatus, according to the present invention, and FIG. 13 is a flowchart illustrating the method of the present invention.

Referring to the drawings, the apparatus of the present invention includes a cylindrical casing 4 which is open at upper and lower ends thereof. Traps are installed in the casing 4 to collect various kinds of byproducts. An upper lid 41 having a byproduct inlet port 43 and a lower lid 42 having a byproduct outlet port 44 are provided on upper and lower openings, respectively, to close the upper and lower openings. The apparatus is installed between a process chamber 1 and a vacuum pump 2, and collects the byproducts produced from a semiconductor production line.

The apparatus includes several trap units 5, upper and lower plates 6 and 7, trap and plate coupling means 8, a servo motor 9, pressure gauges 12 and 13, upper and lower isolation valves 14 and 15, cleaning-water supply and discharge valves 16 and 17, dry-gas supply and exhaust valves 18 and 19, and a control unit 10.

The trap units 5 are installed in the casing 4 at regular angular intervals via support ribs 11' of a vertical shaft 11, which is provided in the center of the casing 4. In such a state, the trap units 5 are provided between upper and lower plates 6 and 7 and are rotated forwards or backwards according to the driving direction of the servo motor 9. While the trap units 5 are connected to the byproduct inlet and outlet ports 43 and 44, cleaning-water supply and discharge ports 45 and 46, and dry-gas supply and exhaust ports 47 and 48, one of the trap units collects byproducts, and the rest of the trap units are repeatedly cleaned.

The vertical shaft 11 supporting the trap units 5 passes through the center of each of the upper and lower plates 6 and 7. The upper and lower plates 6 and 7 are provided around the trap units 5, are connected to the upper and lower lids 41 and 42 to be spaced apart therefrom by a predetermined interval, and are provided with the byproduct inlet and outlet ports 43 and 44, the cleaning-water supply and discharge ports 45 and 46, and the dry-gas supply and exhaust ports 47 and 48. The upper and lower plates 6 and 7 are provided on the upper and lower portions of the casing 4 in such a way as to contact the upper and lower openings of the trap units 5, and to make the byproduct inlet and outlet ports 43 and 44, the cleaning-water supply and discharge ports 45 and 46, the dry-gas supply and exhaust ports 47 and 48 be selectively coupled to the upper and lower openings of the respective trap units 5.

The trap and plate coupling means 8 are installed on the upper and lower openings of the trap units 5 in such a way as to extend or contract. At normal times, the trap and plate coupling means 8 are extended, thus sealing the air between the upper and lower plates 6 and 7 and the trap units 5. Meanwhile, when the trap units 5 rotate in a predetermined direction, the trap and plate coupling means contract, thus allowing the trap units 5 to smoothly rotate without contacting the upper and lower plates 6 and 7.

The servo motor 9 is connected at a shaft thereof to the lower end of the vertical shaft 11. In such a state, the servo motor 9 is mounted to the bottom of the lower plate 7. The servo motor 9 is rotated forwards or backwards in response to the output signal of the control unit 10, thus rotating the trap units 5 within a predetermined angular range.

The pressure gauges 12 and 13 are respectively mounted on the byproduct inlet port 43 and the casing 4, thus detecting and displaying the pressure in the trap unit 5 that is currently collecting the byproduct and the pressure in the casing 4. Simultaneously, each of the pressure gauges 12 and 13 transmits the detected pressure signal to the control unit 10, thus allowing a person to know the time when the trap unit 5 will be replaced with another one.

The upper and lower isolation valves 14 and 15 are mounted to the byproduct inlet and outlet ports 43 and 44, respectively, thus controlling the ingress of the byproducts into a specific trap unit 5 or the discharge of the byproducts from the trap unit 5.

The cleaning-water supply and discharge valves 16 and 17 are mounted to the cleaning-water supply and discharge ports 45 and 46 to control the supply and discharge of cleaning water. The dry-gas supply and exhaust valves 18 and 19 are mounted to the dry-gas supply and exhaust ports 47 and 48 to control the supply and discharge of dry gas.

The control unit 10 controls the operation of the servo motor 9, the trap and plate coupling means 8, and the valves, according to the control program.

In this case, the control unit 10 is provided with a pressure-difference comparison part 101 which detects the difference between the pressure in the casing 4 and the pressure in the trap unit 5 which is collecting the byproduct, timers 102 and 103 for setting cleaning-water and dry-air supplying times, and cleaning number and pressure setting parts 104 and 105.

Further, thermoelements 20 are additionally mounted on the outer portions of the trap units 5. When the byproducts are being collected, the thermoelements 20 allow the trap units 5 to maintain low temperature, thus increasing the collecting ability. Meanwhile, when the trap unit 5 filled with the byproducts is cleaned using the cleaning water and the interior of the trap unit 5 is dried using the dry gas, the thermoelements 20 heat the trap unit 5 to high temperature, thus increasing drying efficiency.

The dry-gas exhaust port 48 connected to each trap unit 5 is coupled to the byproduct outlet port 44 connected to the vacuum pump 2. As necessary, dry-gas supply and exhaust ports 47' and 48' having dry-gas supply and exhaust valves 18' and 19' are installed to pass through the upper and lower lids 41 and 42 of the casing 4. Each dry-gas exhaust port 48' is coupled to the byproduct outlet port 44 connected to the vacuum pump 2.

Each trap and plate coupling means 8 includes an encoder motor 81, a bellows housing 83, a bellows 84, a spring 85, and an O-ring 86. The encoder motor 81 is provided with a ring-shaped rotor 82 having on an inner surface thereof a thread 821 that engages with a thread 831 of the bellows housing 83. The encoder motor 81 is mounted around each of the upper and lower openings of each trap unit 5.

The bellows housing 83 has on an outer surface thereof the thread 831 that is fastened to the rotor 82 of the encoder motor 81 through a screw-type fastening method. The bellows housing 83 is installed in the rotor 82 of the encoder motor 81 and contracts or extends the bellows 84 according to the driving direction of the encoder motor 81, and is brought into contact with each of the upper and lower plates 6 and 7, or is spaced apart from each of the upper and lower plates 6 and 7.

The outer end of the bellows 84 is welded to the upper or lower end of the inner surface of the bellows housing 83, while the inner end of the bellows 84 is welded to the inner portion of each of the upper and lower openings of each trap unit 5. According to the moving direction or the moving distance of the bellows housing 83 fastened to the rotor 82 of the encoder motor 81, the bellows 84 contracts or extends, thus air-tightly sealing the gap between the bellows housing 83 and each trap unit 5.

The spring 85 is elastically mounted between the end of the bellows housing 83 fastened to the rotor 82 and the upper or lower surface of each trap unit 5.

The O-ring 86 is coupled to each of the upper and lower surfaces outside the bellows housing 83, and seals the junctions between the bellows housing 83 and the upper and lower plates 6 and 7.

Meanwhile, the control method of the present invention includes the step of opening the dry-gas exhaust valves 19. At the step, when a signal indicating a replacement time according to the variation in pressure of the trap unit 5 which is being operated is input from the process chamber 1 to the control unit 10, the upper isolation valve 14 mounted to the byproduct inlet port 43 is closed, and the lower isolation valve 15 mounted to the byproduct outlet port 44 is opened. Thereafter, the dry-gas exhaust valves 19, connected to the trap units 5 that have been cleaned and remain in a waiting mode, are opened, and the dry-gas exhaust valve 19 connected between the casing 4 and the byproduct outlet port 44 is opened.

Next, when the difference (pg1−pg2=pg) between the inlet pressure and the outlet pressure of the trap unit 5 which is currently operating is measured and the measured difference is less than a preset value (|pg|<preset value), the dry-gas exhaust valves 19 connected to the trap units which have been cleaned and remain in a waiting mode and the lower isolation valve 15 are closed. The trap and plate coupling means 8 are operated so as to contract, so that the upper and lower portions of each trap unit 5 are spaced apart from the upper and lower plates 6 and 7.

After the servo motor 9 is driven in a predetermined direction to change the position of the trap units 5, the trap and plate coupling means 8 is operated to extend, so that the upper and lower portions of each trap unit 5 come into close contact with the upper and lower plates 6 and 7, thus remaining airtight.

Next, each of the upper and lower isolation valves 14 and 15 is opened, and a predetermined amount of cleaning water is supplied to the trap unit 5, which was full of the byproducts. Such a state is maintained for a preset time (e.g., 2 to 5 minutes). Thereafter, the cleaning-water discharge valve 17 is opened, thus discharging cleaning water. This operation is repeated a preset number of times (e.g. 4 to 6).

The thermoelements 20 mounted to the outer portion of each trap unit 5 are driven for a preset time (e.g. 20 to 30 minutes), thus heating the trap unit 5. Simultaneously, the dry-gas supply valves 18 and the cleaning-water discharge valves 17 are opened.

When the preset time has passed, the heating operation is ceased, and the dry-gas supply valves 18 and the cleaning-water discharge valves 17 are closed. Thereby, the cleaning operation is completed.

The operational effects of the present invention having the above-mentioned construction and method will be described below.

First, the apparatus of the present invention includes the cylindrical casing 4 sealed by the upper and lower lids 41 and 42. Several (2 or 3) trap units 5 each having the trap and plate coupling means 8, the upper and lower plates 6 and 7, and the servo motor 9, are installed in the casing 4. The pressure gauges 12 and 13, the upper and lower isolation valves 14 and 15, the cleaning-water supply and discharge valves 16 and 17, the dry-gas supply and exhaust valves 18 and 19, and the control unit 10 are mounted to the outer portion of the casing 4.

In this case, the trap units 5 are mounted via the support ribs 11' to the vertical shaft 11 which is rotatably provided in the center of the casing 4 at a predetermined angular interval (e.g.

if the trap units are two in number, the trap units are arranged at an angular interval of 180 degrees, and if the trap units are three in number, the trap units are arranged at an angular interval of 120 degrees). In such a state, according to the driving direction of the servo motor 9, which engages with the vertical shaft 11, the trap units are rotated forwards or backwards by 180 degrees or 120 degrees between the upper and lower plates 6 and 7. The trap units are coupled to the byproduct inlet and outlet ports 43 and 44, the cleaning-water supply and discharge ports 45 and 46, and the dry-gas supply and exhaust ports 47 and 48, which are installed to be connected to the upper and lower plates 6 and 7. One of the trap units 5 collects the byproducts. As such, while one of the trap units 5 collects the byproducts, one or two trap units 5 are repeatedly cleaned using the cleaning water and the dry gas, such as nitrogen.

The internal construction of the trap units 5 is equal to the construction of the conventional byproduct collecting apparatus, except that it has a smaller size.

Meanwhile, the casing 4 may have polygonal shapes, such as a symmetrical polygonal shape or an asymmetrical polygonal shape, without being limited to the cylindrical shape.

Further, the upper and lower plates 6 and 7 are installed in the casing 4 to be positioned under and above the upper and lower lids 41 and 42 and spaced apart therefrom by a predetermined distance, while the vertical shaft 11 supporting the trap units 5 passes through the centers of the upper and lower plates 6 and 7. The upper and lower plates 6 and 7 are located around the trap and plate coupling means 8 mounted to the upper and lower openings of the trap units 5 and are spaced apart from the upper and lower lids 41 and 42 by a predetermined interval. The upper and lower plates are provided with the byproduct inlet and outlet ports 43 and 44, the cleaning-water supply and discharge ports 45 and 46, and the dry-gas supply and exhaust ports 47 and 48.

Thus, when the trap units 5 are rotated clockwise or counterclockwise at a predetermined angle according to the driving direction of the servo motor 9, and the bellows 84 of each trap and plate coupling means 8 is extended by the operation of the trap and plate coupling means 8, the upper and lower openings of the trap units 5 are selectively connected to the byproduct inlet and outlet ports 43 and 44, the cleaning-water supply and discharge ports 45 and 46, and the dry-gas supply and exhaust ports 47 and 48, which are mounted to the upper and lower plates 6 and 7. Simultaneously, the trap units 5 are in close contact with the upper and lower plates 6 and 7 by the O-rings 86 mounted to the ends of the bellows 84 of the trap and plate coupling means 8, thus remaining airtight.

In this case, each trap and plate coupling means 8 is provided with the encoder motor 81 having the ring-shaped rotor 82, the bellows housing 83, the bellows 84, the spring 85, and the O-ring 86. The trap and plate coupling means 8 are mounted to the upper and lower openings of the trap units 5 in such a way as to contract or extend. At normal times, the trap and plate coupling means 8 are extended, thus air-tightly sealing the gaps between the upper and lower plates 6 and 7 and the trap units 5. When the trap units 5 are rotated in a predetermined direction, the trap and plate coupling means 8 contract, thus allowing the trap units 5 to smoothly rotate without coming into contact with the upper and lower plates 6 and 7.

The encoder motor 81 has the shape of a ring. The ring-shaped rotor 82 having on the inner surface thereof the thread 821 which engages with the thread 831 of the bellows housing 83 is rotatably installed in the encoder motor 81. The encoder motor 81 is secured around each of the upper and lower openings of each trap unit 5.

Further, the bellows housing 83 has on the outer circumference thereof the thread 831 which engages with the thread 821 of the rotor 82 of the encoder motor 81 through a screw-type fastening method. The bellows housing 83 is installed in the rotor 82 of the encoder motor 81 in such a way as to move up and down, and moves up and down according to the driving direction of the rotor 82 of the encoder motor 81, thus contracting or extending the bellows 84. Further, the bellows housing 83 makes each trap and plate coupling means 8 itself come into close contact with the upper and lower plates 6 and 7 and be spaced apart from the upper and lower plates 6 and 7.

The bellows 84 has an extendable shape. The outer end of the bellows 84 is welded to the upper or lower end of the inner portion of the bellows housing 83, while the inner end of the bellows 84 is welded to the inner portion of the upper or lower opening of each trap unit 5. According to the vertical moving direction and the moving distance of the bellows housing 83 coupled to the rotor 82 of the encoder motor 81, the bellows 84 is contracted or extended, thus air-tightly sealing the gap between the bellows housing 83 and each trap unit 5.

Meanwhile, if the rotor 82 of the encoder motor 81 is fastened to the bellows housing 83 only through a screw-type fastening method, the bellows housing 83 may move up and down in the rotor 82 due to the tolerance of the threads when the bellows housing 83 moves up and down according to the rotating direction of the rotor 82. Further, when the bellows housing is extended, the upper or lower end of the bellows housing 83 may not be in contact with the upper or lower plate 6 or 7.

Thus, according to the present invention, the spring 85 is installed between the inner end of the bellows housing 83 fastened to the rotor 82 through the screw-type fastening method and the upper or lower surface of each trap unit 5. Due to such a construction, the bellows housing 83 is biased to the upper or lower plate 6 and 7 by the elastic force of the spring 85. Thereby, when the bellows housing 83 moves up and down according to the rotating direction of the rotor 82, the bellows housing 83 is not moved up and down in the rotor 82 because of the elastic force of the spring 85 even though the threads have tolerance. Further, when the bellows housing 83 is extended, the upper or lower end of the bellows housing 83 is in close contact with the upper or lower plate 6 or 7.

Moreover, according to the present invention, the O-ring 86 is installed in the groove formed in the upper or lower surface of the outer portion of the bellows housing 83. Thus, when the bellows housing 83 is moved up and down by the extension of the bellows 84, so the upper or lower surface of the bellows housing 83 is in contact with the upper or lower plate 6 or 7, the contact part of the bellows housing 83 and the upper or lower plate 6 and 7 is perfectly sealed by the O-ring 86. Thereby, the leakage of the byproducts through the gap can be prevented.

According to this embodiment, each trap and plate coupling means 8 uses the encoder motor 81 having the ring-shaped rotor 82 as the driving means. However, a hydraulic or pneumatic cylinder may be used as the driving means, without being limited to the encoder motor. It is apparent to those skilled in the art that the same effect is achieved using the hydraulic or pneumatic cylinder.

Further, according to this embodiment, each trap and plate coupling means 8 is installed on the upper or lower surface of each trap unit 5, thus adjusting the entire length of the trap unit, therefore connecting or disconnecting the trap unit 5 to or from the upper or lower plate 6 or 7. Conversely, each trap and plate coupling means 8 may be constructed such that the length of the byproduct inlet or outlet port 43 or 44 is changed (i.e. the byproduct inlet or outlet port itself is constructed to have the shape of a bellows), and may be installed between the upper or lower lid 41 or 42 and the upper or lower plate 6 or 7 so that the upper or lower plate 6 or 7 moves up and down to the upper or lower opening of each trap unit 5. Those skilled in the art can easily understand such a construction.

The servo motor 9 has a reduction gear therein. In the state where the servo motor 9 is mounted to the lower surface of the lower plate 7, the shaft of the servo motor 9 is coupled to the lower end of the vertical shaft 11 which is installed to pass through the centers of the upper and lower plates 6 and 7. The servo motor 9 rotates forwards or backwards in response to the output signal from the control unit 10, thus rotating the trap units 5 within a predetermined angular range, therefore changing the position of the trap unit 5 which is full of the byproducts and the position of the trap units 5 which are cleaned and remain in a waiting mode.

Meanwhile, the pressure gauges 12 and 13 are installed to the byproduct inlet port 43 which are connected to the trap units 5 through the upper lid 41 and the upper plate 6, and the casing 4, respectively. The pressure gauges 12 and 13 detect and display the pressure in the trap unit 5 that is currently collecting the byproducts and the pressure in the casing 4. Simultaneously, the pressure gauges 12 and 13 transmit the detected pressure signals to the control unit 10, so that the control unit 10 indicates the replacement time of the trap unit 5.

Since the upper and lower isolation valves 14 and 15 are mounted on the byproduct inlet and outlet ports 43 and 44, respectively, the control unit 10 can control the ingress and discharge of the byproducts which are fed into and then discharged from a specific trap unit 5 among the several trap units 5 that is connected between the process chamber 1 and the vacuum pump 2, according to the predetermined control program.

Further, the cleaning-water supply and discharge valves 16 and 17 and the dry-gas supply and exhaust valves 18 and 19 are mounted to the cleaning-water supply and discharge ports 45 and 46 and the dry-gas supply and exhaust ports 47 and 48, respectively. Thus, the control unit 10 controls the supply and discharge of the cleaning water and the dry gas to and from the trap units 5 excluding the trap unit which is currently connected between the process chamber 1 and the vacuum pump 2, that is, the waiting trap units 5, for a predetermined time (e.g. 2 to 5 minutes) by a predetermined amount and a predetermined number of times (e.g. 4 to 6). While one of the trap units 5 collects the byproducts, the rest of the trap units 5 are cleaned and remain in a waiting mode. When the trap unit 5 which is currently collecting the byproducts is saturated with the byproducts, the operation of replacing the trap unit 5 with another trap unit is automatically conducted. That is, the trap unit saturated with the byproducts moves to another place, and one of the trap units which are cleaned and remain in the waiting mode moves to the byproduct inlet and outlet ports 43 and 44. Thereby, the operation of collecting the byproducts in a clean trap unit can be continuously conducted.

Meanwhile, the control unit 10 is provided with the pressure-difference comparison part 101, the timers 102 and 103 for setting the cleaning-water and dry-gas supplying times, and the cleaning-number and pressure setting parts 104 and 105. The internal pressure of the casing 4 and the pressure of the trap unit 5 which is collecting the byproducts are input from the pressure gauges 12 and 13 to the pressure-difference comparison part 101, so that the pressure-difference comparison part 101 detects the pressure difference between the casing 4 and the trap unit 5. Although not shown in the drawings, the control unit is provided with a drive part for driving the valves, the motor, and the thermoelements 20, and is provided with a predetermined control program. By executing the control program, the driving operation of the servo motor 9, the trap and plate coupling means 8, the valves, and the thermoelements is controlled.

In this case, the times set by the timers 102 and 103 for setting the cleaning-water and dry-gas supplying times, and the cleaning number and pressure-difference set by the cleaning-number and pressure setting parts 104 and 105 may be changed according to the size of the collecting apparatus or the kind of byproducts produced in the semiconductor manufacturing process. When the waiting time is provided for 2 to 5 minutes after the cleaning water is supplied, the cleaning operation is repeated 4 to 6 times, and the supply of the dry gas and the heating operation through the thermoelements 20 are conducted for 8 to 10 minutes, most of the byproducts collected in the trap unit 5 may be removed by the cleaning water. Moreover, all the molecules of the remaining byproducts can be discharged.

Meanwhile, when the byproducts are collected through the trap unit 5 connected to the byproduct supply port 43, the efficiency of collecting the byproducts is low if only the temperature of various kinds of byproducts fed and collected in the trap unit 5 is used. Further, when the trap unit 5 is saturated with the byproducts, the trap unit is rotated to a predetermined direction and is then cleaned using cleaning water or dry gas. However, the cleaning and drying operation may not be smoothly conducted at normal temperature.

Thus, according to the present invention, several thermoelements 20 are additionally mounted to the outer portions of the trap units 5. Thereby, in order to keep an associated trap unit 5 at a low temperature when the byproducts are collected, the thermoelements 20 are operated as cooling devices, thus increasing the effect of collecting the byproducts. Meanwhile, when the trap unit 5 filled with the byproducts is cleaned by the cleaning water and thereafter the interior of the trap unit 5 is dried through the dry gas, the thermoelements 20 are operated as heating devices, thus increasing a dry efficiency through heating.

In this case, each of the thermoelements 20 is a PTC device having constant-temperature characteristics. The cooling operation and the heating operation of the thermoelements 20 are changed by changing the supply direction of DC voltage supplied to the thermoelements 20. For example, when one desires to operate the thermoelements 20 as a cooling device, positive voltage is supplied to a first terminal and negative voltage is supplied to a second terminal. Conversely, when one desires to operate the thermoelements 20 as a heating device, negative voltage is supplied to the first terminal and positive voltage is supplied to the second terminal.

Further, according to the present invention, the cleaning-water discharge port 46 is coupled to a cleaning-water collecting container (not shown) which is installed outside the apparatus of the invention, thus causing the cleaning water to remain in the trap units for a predetermined period of time. Thereby, when the cleaning water in which various kinds of byproducts are soluble is discharged, the cleaning water is collected in the additional cleaning-water collecting container, so that environmental pollution is prevented. Further, the dry-gas exhaust port 48 connected to each trap unit 5 is coupled to the byproduct discharge port 44 connected to the vacuum pump 2, so that the dry gas passing through the trap unit 5 which is being cleaned can be collected in a gas collecting unit (not shown) through the vacuum pump 2 without being discharged to the outside.

Meanwhile, as necessary, the dry-gas supply and exhaust ports 47' and 48' having the dry-gas supply and exhaust valves 18' and 19' may be installed in the casing 4 through the upper and lower lids 41 and 42 of the casing 4, in addition to the dry-gas supply and exhaust ports 47 and 48 connected to the trap units 5. In this case, the dry-gas exhaust port 48' is coupled to the byproduct discharge port 44 connected to the vacuum pump 2.

In order to replace the trap unit 5 that is filled with the byproducts with the new trap unit that has been cleaned, the trap and plate coupling means 8 are operated to separate the trap units 5 from the upper and lower plates 6 and 7. At this time, the casing 4 may be soiled by the byproducts discharged from the trap unit into the casing. In order to clean the soiled casing 4, the dry gas is supplied or discharged through the dry-gas supply or exhaust port 47' or 48' such that the dry gas passes through the interior of the casing 4. Through such a method, it is possible to completely clean the interior of the dirty casing 4.

Meanwhile, when various kinds of byproducts produced in the semiconductor manufacturing process are collected using the apparatus of this invention, the control unit 10 continues to detect whether the signal indicating the replacement time is input from the process chamber 1 in response to the pressure variation in the pressure of the trap unit 5 that is currently being operated.

That is, in the normal state, the byproducts produced in the process chamber are collected in one of the trap units 5 installed in the collecting apparatus, that is, the trap unit 5 which is currently connected to the byproduct inlet port 43. As the semiconductor manufacturing process is performed, the total amount of the byproducts collected in the associated trap unit 5 is gradually increased. Consequently, the entire passage extending from the process chamber 1 to the vacuum pump 2 is blocked by the trap unit 5.

As such, the trap unit 5 must be automatically replaced with a new trap unit, before the trap unit 5 provided between the process chamber 1 and the vacuum pump 2 is completely blocked. The process chamber 1 determines that automatic replacement is required.

As the passage of the trap unit 5 is narrowed, it is difficult to maintain a vacuum created by the vacuum pump 2 in the process chamber 1. Consequently, this causes a rise of pressure in the process chamber 1 and hinders the control of pressure.

Further, the amount of the byproducts collected in the trap unit 5 which is collecting the byproducts now can be estimated using the amount or time of the production which is progressed in the process chamber 1.

Thus, the automatic replacement signal determined by the rise in pressure, the production amount, the production time, etc. is transmitted from the process chamber 1 to the control unit 10, so that the trap unit is automatically replaced with another one.

In this case, the pressure means the pressure applied to a wafer processing operation in the process chamber 1. The pressure is varied according to the applied process. If the trap unit 5 is blocked, so that it cannot maintain pressure lower than the process pressure, it is difficult to control the process pressure. Thus, this is recognized as the time when the trap unit 5 is to be replaced with another one.

In this case, the process chamber 1 determines the replacement time and announces the replacement time for the trap unit 5. The degree of rise in pressure providing the replacement signal depends on the applied process of the process chamber.

For example, when the process pressure of the process chamber which is mass producing now is set to 2 Torr and the pressure exceeds 2 Torr, so that it is difficult to control the pressure, the process chamber generates an alarm signal. At this time, it is necessary to replace the trap unit with another one.

The pressure difference between the trap unit 5 and the casing 4 is set to about 0.1 Torr (100 mTorr) or less by the pressure setting part 105 so as to prevent a problem caused by the pressure difference even though the trap unit 5 contracts.

As such, when the automatic replacement signal is input from the process chamber 1, the control unit 10 closes the upper isolation valve 14, thus isolating the trap unit 5 from the process chamber 1.

At this time, the lower isolation valve 15 is opened, so that the pumping operation is continuously performed in the trap unit 5 of the process area.

Further, in order to create a vacuum in two trap units 5 of the cleaning area, the dry-gas exhaust valves 19 connected to the respective trap units 5 are opened. Simultaneously, in order to create a vacuum in the casing 4, the dry-gas exhaust valve 19 connected to the byproduct discharge port 44 is opened. Consequently, a vacuum is created in the casing 4 and the trap units 5.

Meanwhile, in order to automatically replace the trap unit 5, the upper and lower sealing parts of the trap unit 5 must be opened. Thus, the pressure in the trap units 5 must be identical with the pressure in the rest of the space in the casing 4. This must be checked beforehand.

Thus, the control unit 10 reads the pressure in the trap unit 5 which collects the byproducts, through the pressure gauge 12. The external space of the trap units 5, that is, the pressure in the casing 3, is read through the pressure gauge 13. Thereafter, the difference (pg1−pg2=pg) between the inlet pressure and the outlet pressure of the trap unit 5 which is currently being operated is measured.

As a result, when the pressure difference is larger than the preset value (e.g. 100 mTorr), namely, /pg/≧the preset value, the valves remain open, so as to pump the trap units 5 and other spaces (e.g. the interior of the casing 4), as described above. When the pressure difference between the pressure gauges 12 and 13 is lower than the preset value, namely, /pg/<the preset value, the lower isolation valve 15 and the dry-gas exhaust valves 19 connected to the trap units 5, which are cleaned and remain in the waiting mode, are closed.

Subsequently, the trap and plate coupling means 8 are contracted so as to reduce the overall length of the trap units 5. Thereby, the upper and lower portions of each trap unit 5 are spaced apart from the upper and lower plates 6 and 7. Afterwards, the upper and lower isolation valves 14 and 15 are closed to separate the cleaning line from the byproduct collecting line.

As described above, the trap and plate coupling means 8 are constructed so that the bellows 84 are installed to the upper and lower portions of the trap units 5 to be contracted or extended, and the O-rings 86 are mounted to the uppermost and lowermost parts of the bellows housings 83 to bring the bellows housings 83 into airtight contact with the upper and lower plates 6 and 7. The bellows housing 83, contracting each bellows 84 as shown in FIG. 12a or extending each bellows 84 as shown in FIG. 12b, has on the outer circumferential surface thereof the thread 831. The thread 821 is formed on the inner surface of the rotor 82 of each of the upper and lower encoder motors 81 to correspond to the thread 831.

Further, the encoder motor 81 is coupled to the outer portion of the rotor 82 such that the encoder motor is not separated from the rotor 82. The spring 85 is installed between the rotor 82 and the bellows housing 83 so that the upper or lower portion of each trap unit 5 is in close contact with the upper or lower plate 6 or 7.

Thus, the rotor 82 of the encoder motor 81 moves the bellows housing 83 up and down, so that the bellows 84 is contracted or extended, and thereby the upper or lower portion of each trap unit 5 is spaced apart from or is in close contact with the upper or lower plate 6 or 7. At this time, the spring 85 enhances the contact force.

Meanwhile, the control unit 10, which contracts the several trap units 5 using the trap and plate coupling means 8, drives the servo motor 9 in a predetermined direction, thus changing the position of the trap units 5.

Since the shaft of the servo motor 9 rotating the trap units 5 is connected to the vertical shaft 11 rotating the trap units 5 via the support ribs 11', the trap units 5 are rotated along with the vertical shaft 11 according to the rotating direction of the servo motor 9, and are changed in position. The servo motor 9 can rotate the three trap units 5 clockwise or counterclockwise by an angle of 120 degrees.

Of course, the angle may be changed depending on the number of the trap units 5. If the number of trap units 5 is two, the angle may be 180 degrees. Further, if the number of trap units 5 is four, the angle may be 90 degrees.

As such, when the position of the trap units 5 is changed, the control unit 10 moves the trap and plate coupling means 8 in the opposite direction, that is, moves the trap and plate coupling means 8 such that they are extended. Thereby, the upper or lower portion of each of the trap units 5 comes into close contact with the upper or lower plate 6 or 7 to remain airtight.

Subsequently, in order to clean the trap unit 5 collecting the byproducts, the upper and lower isolation valves 14 and 15 and the cleaning-water supply valve 16 are opened, so that a predetermined amount of cleaning water is supplied to the trap unit 5 which is full of the byproducts. This state is maintained for a preset time (2 to 5 minutes) such that the byproducts are soluble in the cleaning water. Thereafter, the cleaning-water discharge valve 17 is opened to discharge the cleaning water. The operations are repeated a preset number of times (i.e. a number which is set to sufficiently dissolve the byproducts; e.g. 4 to 6).

When the cleaning operation has been completed, the thermoelements 20 mounted to the outer portion of each of the trap unit 5 are driven for a preset time (e.g. 20 to 30 minutes), thus heating the trap unit 5. Simultaneously, the dry-gas supply valve 18 and the cleaning-water discharge valve 17 are opened, thus discharging the dry gas and the cleaning water.

As such, when the trap unit 5 has been cleaned and dried by heating and supplying the dry gas for a preset time (i.e. 20 to 30 minutes), the power supplied to the thermoelements 20 is cut off, so that the heating operation is ceased. The dry-gas supply valve 18 and the cleaning-water discharge valve 17 are closed, and the cleaning operation is completed. The trap unit remains in the waiting mode for the subsequent collection.

When the collection amount of the automatically replaced trap unit 5 is increased, and an automatic replacement signal is input from the process chamber 1, the automatic replacing operation and the cleaning operation are repeatedly conducted in the above-mentioned order. In this case, the rotating direction of the servo motor 9 rotating the trap units 5 and the area to be cleaned may be changed.

For example, the servo motor 9 recognizes the encoder position in the range from zero to 360 degrees, when turned once clockwise. If the current encoder position is zero, the servo motor 9 rotates clockwise by 120 degrees, and the trap unit of the first cleaning area is cleaned when the trap unit is automatically replaced in the collecting apparatus having three trap units.

Further, when the current encoder position is 120 degrees, the servo motor 9 rotates counterclockwise by 240 degrees, so that the trap unit of the first cleaning area is cleaned.

When the current encoder position is 240 degrees, the servo motor 9 rotates clockwise by 120 degrees, and the trap unit of the first cleaning area is cleaned.

When the rotating method of the servo motor 9 is set in this way, the cleaning operation is conducted in the first cleaning area. Meanwhile, when the rotating method is set to be opposite to the above-mentioned method, the cleaning operation is conducted in the second cleaning area.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As described above, the present invention provides an automatically replaceable apparatus for collecting byproducts in semiconductor producing equipment and a method of controlling the apparatus, in which several trap units are rotatably installed in the collecting apparatus to collect byproducts produced during the semiconductor fabricating process, such as ignitable gas, corrosive gas, noxious gas or harmful compounds, such that, when a predetermined amount of byproduct is collected in any one of the trap units, the task of collection of the byproduct is automatically transferred to another trap unit which has been cleaned, thus increasing the operation rate of the byproduct collecting apparatus, therefore increasing the production of semiconductors, preventing injuries to workers due to the effluence of harmful substances or noxious gases which may be produced when the byproduct collecting apparatus is replaced with another one, and ensuring safety.

The invention claimed is:

1. An automatically replaceable collecting apparatus for collecting byproducts produced in a semiconductor production line, the collecting apparatus being constructed so that a trap collecting various kinds of byproducts is installed in a casing which is open at a top and bottom thereof and so that a lid having each of a byproduct inlet port and a byproduct outlet port is mounted to each of upper and lower openings of the casing to close each of the upper and lower openings, and being installed between a process chamber and a vacuum pump, the collecting apparatus comprising:

a plurality of trap units mounted to a vertical shaft at regular angular intervals, and rotating leftwards or rightwards between upper and lower plates in response to a driving direction of a servo motor, one of the trap units collecting the byproducts and the rest of the trap units being repeatedly cleaned;

the upper and lower plates supporting the vertical shaft to which the trap units are mounted such that the vertical shaft passes through centers of the upper and lower plates, and being installed to be spaced apart from the upper and lower lids by a predetermined interval, so that the upper and lower plates contact the upper and lower openings of the trap units at upper and lower positions of the casing, the upper and lower plates connecting byproduct inlet and outlet ports, cleaning-water supply and discharge ports, and dry-gas supply and exhaust ports to the respective trap units;

trap and plate coupling means extended at normal times to air-tightly seal gaps between the upper and lower plates and the trap units, the trap and plate coupling means being contracted when the trap units are rotated in a predetermined direction for the replacement of the trap units, thus allowing the trap units to smoothly rotate;

the servo motor mounted to a lower surface of the lower plate while a shaft of the servo motor is connected to a lower end of the vertical shaft, and rotating forwards or backwards in response to a signal output from a control unit, thus rotating the trap units within a predetermined angular range; and the control unit for controlling the operation of the servo motor, the trap and plate coupling means, and various kinds of valves according to a control program.

2. The automatically replaceable collecting apparatus according to claim 1, wherein two, three, or four trap units are installed in the casing at angles of 180 degrees, 120 degrees, or 90 degrees.

3. The automatically replaceable collecting apparatus according to claim 1, further comprising:

a pressure gauge mounted to each of the byproduct inlet port and the casing, thus detecting and displaying pressure in a trap unit that is currently collecting the byproducts and pressure in the casing, and simultaneously transmitting detected pressure signals to the control unit, thus allowing a time when the trap unit is replaced with another one to be indicated.

4. The automatically replaceable collecting apparatus according to claim 3, further comprising:

upper and lower isolation valves mounted on the byproduct inlet and outlet ports, respectively, so as to control the ingress of the byproducts into a specific trap unit or the discharge of the byproducts from the trap unit.

5. The automatically replaceable collecting apparatus according to claim 1, further comprising:

cleaning-water supply and discharge valves and dry-gas supply and exhaust valves provided on the cleaning-water supply and discharge ports and the dry-gas supply and exhaust ports, respectively, thus controlling the supply and discharge of cleaning water and dry gas.

6. The automatically replaceable collecting apparatus according to any one of claims 1 to 5, wherein the control unit comprises:

a pressure-difference comparison part to compare pressure in the casing with pressure in the trap unit collecting the byproducts, thus detecting a pressure difference;

timers for setting a cleaning-water supplying time and a dry-gas supplying time; and setting parts for setting a cleaning number and pressure.

7. The automatically replaceable collecting apparatus according to claim 1, further comprising:

a thermoelement mounted to an outer portion of each of the trap units, the thermoelement performing a cooling function when the trap unit collects the byproducts, and generating heat when the trap unit is dried after being cleaned.

8. The automatically replaceable collecting apparatus according to claim 1, wherein the dry-gas exhaust port connected to each of the trap units is coupled to the byproduct discharge port connected to the vacuum pump.

9. The automatically replaceable collecting apparatus according to claim 1, wherein the dry-gas supply and exhaust ports having the dry-gas supply and exhaust valves are formed through the upper and lower plates of the casing, the dry-gas exhaust port being coupled to the byproduct discharge port connected to the vacuum pump.

10. The automatically replaceable collecting apparatus according to claim 1, wherein the trap and plate coupling means is installed between each of the upper and lower lids and each of the upper and lower plates, or is installed around each of the upper and lower openings of each of the trap units.

11. The automatically replaceable collecting apparatus according to claim 10, wherein the trap and plate coupling means, installed around each of the upper and lower openings of each of the trap units, comprises:

an encoder motor mounted around each of the upper and lower openings of each of the trap units, and comprising a ring-shaped rotor which has on an inner surface thereof a thread engaging with a thread of a bellows housing;

the bellows housing having on an outer surface thereof the thread engaging with the thread of the rotor of the encoder motor, and installed in the rotor of the encoder motor to contract or extend a bellows in response to a driving direction of the encoder motor, so that the bellows housing is in contact with or is spaced apart from each of the upper and lower plates; and the bellows installed such that an outer end thereof is welded to an upper or lower end in the bellows housing and an inner end thereof is welded to an inner surface of the upper or lower opening of each of the trap units, the bellows contracting or extending in response to a vertical moving direction and a moving distance of the bellows housing coupled to the rotor of the encoder motor, thus maintaining airtightness between the bellows housing and each of the trap units.

12. The automatically replaceable collecting apparatus according to claim 11, further comprising:

a spring installed between an end of the bellows housing fastened to the rotor through a screw-type fastening method and an upper or lower surface of each of the trap units, thus biasing the bellows housing to the upper or lower plate.

13. The automatically replaceable collecting apparatus according to claim 12, further comprising:

an O-ring mounted to each of upper and lower surfaces on an outer portion of the bellows housing, thus sealing a contact part between the bellows housing and each of the upper and lower plates.

14. A method of controlling an automatically replaceable byproduct collecting apparatus in semiconductor producing equipment, comprising:

closing an upper isolation valve mounted to a byproduct inlet port, and opening a lower isolation valve mounted to a byproduct discharge port, when a replacement-time indicating signal, corresponding to pressure variation in a trap unit that is currently operating, is input from a process chamber to a control unit, and thereafter, opening a dry-gas exhaust valve of a trap unit that has been cleaned and remains in a waiting mode, and opening a dry-gas exhaust valve provided between a casing and the byproduct discharge port;

closing the lower isolation valve and the dry-gas exhaust valve coupled to the trap unit that has been cleaned and remains in the waiting mode, and contracting trap and plate coupling means, so that an upper or lower portion of each of the trap units moves away from an upper or lower plate, when inlet pressure and outlet pressure of the trap unit that is currently operating are compared with each other and it is determined that a pressure difference is less than a preset value; driving a servo motor in a predetermined direction to change positions of the trap units, and extending the trap and plate coupling means, thus maintaining the upper or lower portion of each of the trap units in close contact with the upper or lower plate, therefore maintaining airtightness;

opening each of the upper and lower isolation valves, supplying a predetermined amount of cleaning water into the trap unit that is filled with byproducts, maintaining the state for a preset time, and thereafter opening a cleaning-water discharge valve, thus discharging the cleaning water, and repeating the cleaning-water discharging operation a preset number of times;

driving a thermoelement mounted to an outer portion of each of the trap units for a preset time, thus heating the trap unit, and simultaneously opening the dry-gas supply valve and the cleaning-water discharge valve; and stopping heating after a preset time has passed, and closing the dry-gas supply valve and the cleaning-water discharge valve, thus completing a cleaning operation.

15. The method according to claim 14, wherein a waiting time after the supply of the cleaning water is 2 to 5 minutes, the number of times the cleaning water is supplied and discharged is 4 to 6, and a time period for supplying dry gas and heating using the thermoelement is 20 to 30 minutes.

* * * * *